United States Patent [19]
Ogasa

[11] Patent Number: 6,063,213
[45] Date of Patent: May 16, 2000

[54] HIGH-PURITY HARD GOLD ALLOY AND METHOD OF MANUFACTURING SAME

[76] Inventor: Kazuo Ogasa, 1958-229, Nakano, Tukuiehou, Tukui-gun, Kanagawa 220-0207, Japan

[21] Appl. No.: 09/216,754

[22] Filed: Dec. 8, 1998

Related U.S. Application Data

[63] Continuation of application No. PCT/JP97/02014, Jun. 11, 1997.

[30] Foreign Application Priority Data

Jun. 12, 1996 [JP] Japan .................................. 8-185242
Jun. 12, 1996 [JP] Japan .................................. 8-185243

[51] Int. Cl.$^7$ ................................ C22C 5/02; C22F 1/14
[52] U.S. Cl. ......................... 148/430; 148/678; 420/507
[58] Field of Search ........................... 420/507; 148/430, 148/678

[56] References Cited

U.S. PATENT DOCUMENTS 5,071,619 12/1991 Hosoda et al. ..................... 420/507
5,702,814 12/1997 Honada et al. ..................... 420/507

FOREIGN PATENT DOCUMENTS 63-57753 3/1988 Japan .
5-179375 7/1993 Japan .
7-70670 3/1995 Japan .
7-70671 3/1995 Japan .

*Primary Examiner*—Deborah Yee
*Attorney, Agent, or Firm*—Frishauf, Holtz, Goodman, Langer & Chick, P.C.

[57] ABSTRACT

A method of manufacturing a high-purity gold alloy for making an electronic member, a dental member or a decorative member. The method includes subjecting a high-purity gold alloy having a Gd content of 1 to 49.9 ppm contained in 99.98 weight % or more gold to a solution heat treatment in which the elements of the high-purity gold alloy are uniformly dispersed at a temperature higher than a solubility curve and then rapidly cooled, and then to an age hardening treatment, before or after a working process for working the high-purity gold alloy into a desired line shape or other desired shape. The age hardening treatment can be performed if the working process is not carried out.

31 Claims, 1 Drawing Sheet

CONDITIONS OF HEAT TREATMENT
ADDITIVE EFFECT OF GADOLINIUM AND BORON
— IMPROVEMENT OF HARDNESS IN SOFTENING CURVE —

HIGH-PURITY HARD GOLD ALLOY AND METHOD OF MANUFACTURING SAME

This is a continuation of International Application No. PCT/JP97/02014 filed Jun. 11, 1997, the entire contents of which are incorporated by reference herein.

BACKGROUND OF THE INVENTION

Field of the Invention

The present invention relates to a method of manufacturing a high-purity gold alloy for making an electronic member, a dental member and a decorative member.

A high-purity gold alloy member as an electronic member is used to connect an electrode on a semiconductor device and an external lead, and has excellent heat resistance. More specifically, the gold alloy has electrical characteristics and bonding characteristics equivalent to or superior to those of conventional gold alloys despite its small wire diameter. The high-purity gold alloy according to the present invention has good electrical characteristics and is especially excellent in mechanical strength and in breaking strength at hot working.

A gold alloy is used in most dental members and has a low purity of gold (Au) ranging from 42 to 95 mass %. The present invention provides a high-purity gold alloy for dental use which has a composition of high-purity gold alloy and yet has improved mechanical characteristics, and retains the characteristics specific to gold, such as corrosion resistance, color tone, etc.

A gold alloy is expected to be pure gold-like yellow in color and bright. A hardening method according to the present invention provides a pure gold-colored, high-purity gold alloy.

BACKGROUND INFORMATION

Fine wires of gold alloy are used chiefly as bonding wires for connecting electrodes on semiconductor devices and external leads. Thermocompression bonding is adopted as a bonding technique. A distal end portion of a fine alloy wire is heated and melted with the use of an electric torch to form a ball, and the ball is compression-bonded to an electrode of a semiconductor device heated at 150 to 300° C. Further, the alloy wire is bonded to an external lead by ultrasonic compression bonding.

A trend for higher integration of semiconductor devices has created needs for a shorter pitch of interelectrode distances, smaller ball diameter, longer path, etc., and thus there is a great demand for finer wires. Conventional high-purity gold alloys have a low breaking strength as a mechanical strength when reduced in wire diameter and thus a difficulty arises in meeting the requirements for further reduction in wire diameter. Fine wires of gold alloy with a high mechanical strength and heat resistance are therefore demanded.

Conventional high-purity gold alloys are admixed with excessive alloying elements for reduction in wire diameter, and due to oxidation of the additive elements during the formation of a ball, an oxide layer is formed on the surface of the ball, with the result that the bonding strength is reduced because the ball fails to be satisfactorily bonded to an electrode at the time of thermocompression bonding. Further, since the ball has increased hardness, its deformation factor and shear strength are low at the time of compression bonding, and in extreme cases, the ball breaks the semiconductor device. Also, a shrinkage hole is liable to be formed at the extremity of the ball, and because of consequent reduction in the bonding surface, the bonding strength after the thermocompresion bonding is reduced.

Gold alloys for dental applications have been in use separately for casting and working. Suitable properties vary depending on uses, and therefore, gold alloys with low to high hardness and low to high tensile strength are available on the market. Gold alloys have been considered to be an ideal material because they can be melted even with the use of town gas and thus are easy to cast and also they have good conformability. However, gold alloys, which are expensive, do not have high purity and satisfactory strength, and the characteristics specific to gold, such as corrosion resistance, color tone, etc. could not be fully enjoyed.

Gold alloys having a hardness and a tensile strength as mechanical properties ranging from 80 to 280 Hv and from 350 to 1100 MPa, respectively, are used for different applications. As additives added to the alloys, those additives which have a large volume percentage and which change the color tone are mainly used. Therefore, there is a demand for additives that are small in volume percentage and can retain a bright pure gold color.

Conventional gold alloys are admixed with Cu to increase the hardness by age hardening of the ordered lattice, with indium or rhenium to reduce the size of crystal grains, and with palladium to enhance the corrosion resistance, in such a manner that these characteristics are well-balanced.

SUMMARY OF THE INVENTION

The present invention concerns a method of hardening a high-purity gold alloy, wherein a high-purity gold alloy having a Gd content of 1 ppm to 49.9 ppm contained in 99.98 weight % or more of gold is subjected to a solution heat treatment in which the elements of the high-purity gold alloy are uniformly dispersed at a temperature higher than a solubility curve and then rapidly cooled, and then subjecting the alloy to an age hardening treatment before or after a working process for working the high-purity gold alloy into a desired line shape or other desired shape. The age hardening treatment can be performed if the working process is not executed.

The present invention also relates to a method of hardening a gold alloy member, wherein a gold alloy having a gadolinium (Gd) content of 50 to 14,999 ppm contained in 98.5 to 99.96 weight % of gold is subjected to a solution heat treatment in which the elements of the gold alloy are uniformly dispersed at a temperature higher than a solubility curve and then rapidly cooled, and then subjecting the alloy to an age hardening treatment involving a heat treatment before or after a working process for working the gold alloy into a desired shape. The age hardening treatment can be performed if the working process is not executed.

The high-purity gold alloy can contain 0.1 to 150 ppm of boron (B).

The present invention is further directed to a method of hardening a high-purity gold alloy, wherein cast high-purity gold alloy is subjected to a solution heat treatment in which a high-purity gold alloy is heated at 600° C. to 2800° C. and then rapidly cooled, and then subjected to an aging treatment at a temperature of 150° C. to 350° C.

In the above-described methods, the solution heat treatment, work hardening and aging treatment can be alternately repeated.

The high-purity gold alloy can contain one or more additives selected from the group consisting of beryllium (Be), aluminum (Al), silicon (Si), calcium (Ca), samarium (Sm), yttrium (Y) and antimony (Sb) which are added to the composition in which gadolinium (Gd) is mixed in the high-purity gold having 99.98 weight % or more of Au, or to the composition having gadolinium (Gd) and boron (B) admixed therein, and which has a total additive amount of additives ranging from 1 to 199 ppm, and which is subjected to the solution heat treatment and the aging treatment.

The high-purity gold alloy can contain one or more rare-earth elements and/or alkaline earth metals which are added to the composition in which gadolinium (Gd) and boron (B) are mixed in the high-purity gold (Au), having 99.98 weight % or more of Au, and which has a total additive amount of additives ranging from 1 to 199 ppm, and which is subjected to the solution heat treatment and the aging treatment.

In the high-purity gold alloy, 5 to 99 ppm of gadolinium (Gd) can be added and the total additive amount can range from 1 to 99 ppm.

The gold alloy can contain one or more additives selected from the group consisting of aluminum (Al), silicon (Si), calcium (Ca), beryllium (Be), yttrium (Y), samarium (Sm) and antimony (Sb) which are added to the composition in which gadolinium (Gd) is mixed with 98.5 to 99.69 weight % gold, or to the composition having gadolinium (Gd) and boron (B) admixed therein, and which has a total additive amount of additives ranging from 3,001 ppm to 14,999 ppm, and which is subjected to the solution heat treatment and the aging treatment.

The gold alloy can contain one or more rare-earth elements and/or alkaline earth metals which are added to the composition in which gadolinium (Gd) is mixed in 98.5 to 99.69 weight % gold, or to the composition having gadolinium (Gd) and boron (B) admixed therein, and which has a total additive amount of additives ranging from 3,001 to 14,999, which is subjected to the solution heat treatment and the aging treatment.

The present invention also concerns a high-purity gold-colored, high-purity hard gold alloy member, wherein Au having a purity of 99.7 weight % or more is admixed with 50 ppm or more of Gd and further with one or more other elements much that a total additive amount of additives is 3,000 ppm.

The present invention is further directed to a high-purity gold-colored, high-purity hard gold alloy member, wherein Au having a purity of 99.0 weight % or more is admixed with 100 ppm or more of Gd, Lu, Ce, La or Yb and further with one or more other elements such that a total additive amount of additives is 10,000 ppm.

The present invention also relates to a method of manufacturing a high-purity gold-colored, high-purity hard gold alloy member, wherein after the gold alloy as defined in either of the two preceding paragraphs is cast, a solution heat treatment is performed at 600° C. to 2,800° C. and then an aging treatment is performed at 100° C. to 400° C. as a post-treatment, or the aging treatment alone is performed.

DETAILED DESCRIPTION OF THE INVENTION

Figure 1:
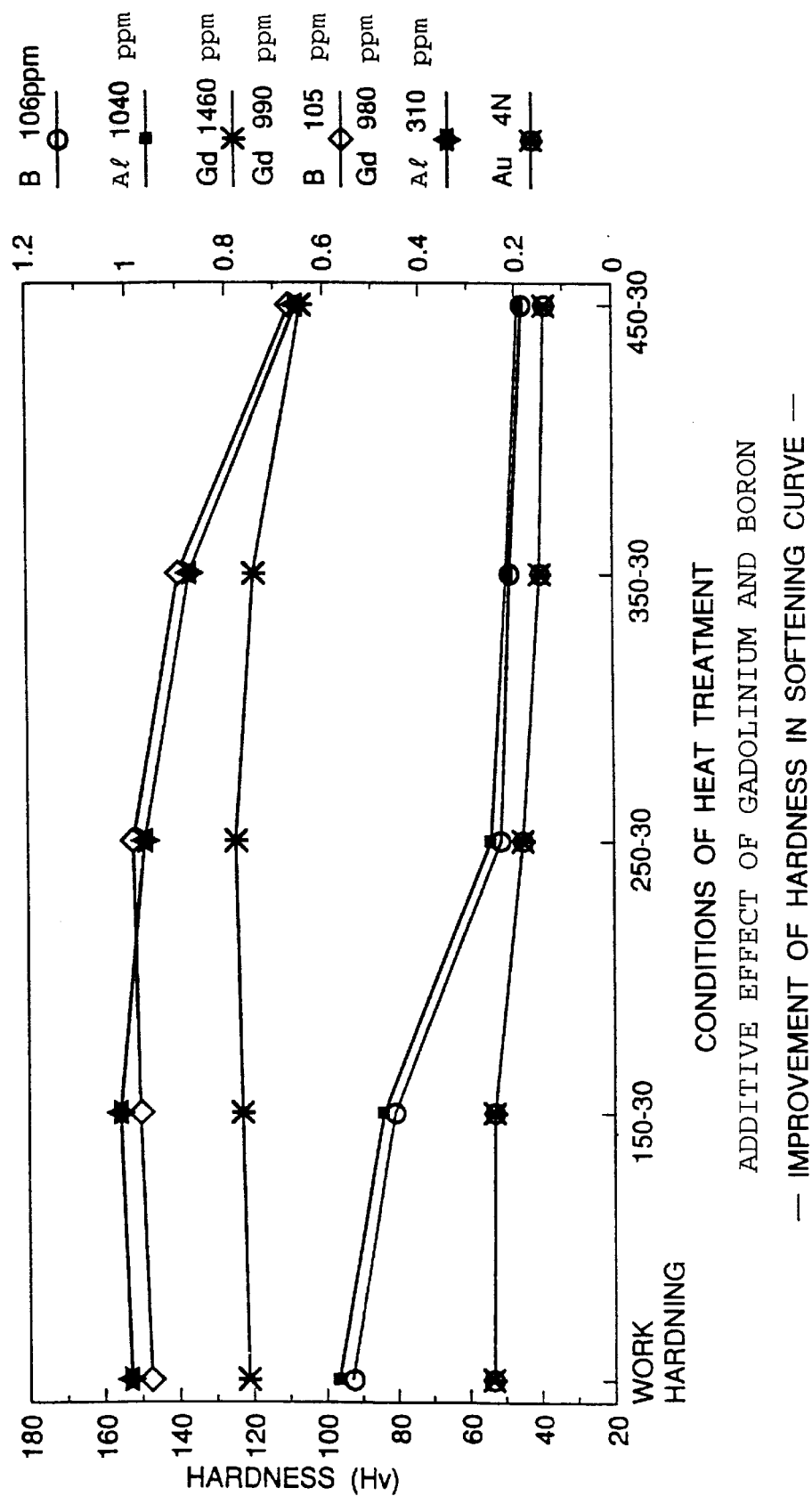
FIG. 1 is a graph which shows improvements in the softening curve achieved by the addition of gadolinium (Gd), boron (B) and aluminum (Al) in a high-purity gold alloy according to the present invention.

By admixing high-purity gold for bonding with gadolinium (Gd) or further with a trace amount of boron (B), mechanical properties, hardness and breaking strength are remarkably improved and also the recrystallization region for the formation of a ball is expanded. It was found that where a small amount of boron (B) coexisted with gadolinium (Gd) and further with Group II and Group III elements, satisfactory additive effects could be achieved (see Table 1).

A fine bonding wire of high-purity gold alloy capable of forming a ball neck suited for reduction in wire diameter and having small bonding grains can be obtained.

There have been proposed gold alloy wires which are admixed with small amounts of Ca, Be, B, etc., to eliminate the drawbacks with high-purity gold wires (Unexamined Japanese Patent Publication (KOKAI) No. 53-105968, No. 53-112059 and No. 59-65440). Manufacture of very fine wires is, however, still associated with many problems to be solved.

A high-purity gold alloy (Au: 99.985% or more) for bonding according to the present invention has a gadolinium content ranging from 1 ppm to 49.9 ppm or from 1 ppm to 99.9 ppm in weight %, and the total amount of the additive is 300 ppm or less in the former case and 199 ppm or less in the latter case. These ranges are wider than that defined in the claims of International Application PCT/JP96/00510.

Boron (B) shows low solid solubility in gold and serves to enhance mechanical strength. Adding a small amount of boron increases work hardness and tensile strength, but heat resistance is not improved. By adding gadolinium (Gd), heat resistance improved and an age hardening effect, a work hardening effect and breaking strength could be remarkably enhanced, and also a synergistic effect was observed (see Table 1).

If an excessive amount of boron (B) is added, hardness increases and the amount of plastic deformation of the ball decreases, with the result that a satisfactory bonding strength is not obtained or that a fine crack is formed in the semiconductor device. Further, a difficulty arises in the formation of a perfectly spherical ball. If the amount of boron added is too small, then the distribution of boron within the gold becomes uneven, and consequent variations in mechanical strength lead to an unstable bonding strength, making the products defective.

If the amount of gadolinium (Gd) added is too small, the effect of the heat treatment is also small. Even if a large amount of gadolinium is added, a well-balanced strength is not fully achieved unless gadolinium is used in combination with other elements.

If an excessive amount of calcium (Ca) is added, a shrinkage hole is formed at the extremity of a ball and the ball formed is not perfectly spherical, lowering the bonding strength. If the Ca content is too small, on the other hand, a cooperating effect and combined effect are not fully achieved. Beryllium (Be), aluminum (Al), antimony (Sb), silicon (Si) and samarium (Sm), when added, showed a tendency similar to that observed in the case where calcium was added.

Adding beryllium showed an effect very similar to that achieved with calcium, and adding yttrium showed an effect closely similar to that obtained with samarium.

Gadolinium (Gd), when added in combination with a rare-earth element or an alkaline earth metal, showed a marked additive effect.

For a gold alloy for dental use, its mechanical strength, hardness, tensile strength and heat resistance could be remarkably enhanced by adding gadolinium (Gd) to the gold alloy and then subjecting the alloy to aging by a heat treatment. Articles admixed with gadolinium are small in volume and the color thereof is close to pure gold.

If gadolinium (Gd) is added and then an aging treatment is performed, hardness, tensile strength and heat resistance are enhanced. Where gadolinium (Gd) is added in combination with the aforementioned additive elements, a synergistic effect can be achieved through the admixture of gadolinium with other elements.

Boron (B) can remarkably enhance the work hardness if added in a small quantity, but has a low solid solubility.

Where calcium (Ca), beryllium (Be), yttrium (Y) or samarium (Sm) is added, hardness by means of work hardening and heat resistance are improved.

Silicon (Si), when added, improves the cast ingot hardness and the work hardness.

Adding aluminum (Al) remarkably increases the tensile strength and also enhances the work hardness. Antimony (Sb) serves to increase the work hardness. Where these elements were added in combination with an alkaline earth metal or a rare-earth element, the above properties could be furthered.

EXAMPLES

To obtain a high-purity gold alloy for bonding wire, mother alloys admixed with the aforementioned elements were prepared by using electrolytic gold having a gold purity of 99.995 weight %. Using a high-frequency vacuum melting furnace, the alloys were individually melted and cast into ingots of 20 mm×20 mm×150 mm.

The cast ingots of high-purity gold alloys having the chemical compositions as shown in Table 1 were first rolled, then worked with the use of a grooved roll, and finally drawn at ordinary temperature to obtain a wire of 20 micrometers in diameter. As a heat treatment, a solution heat treatment was performed first at 800° C., followed by three hours of age hardening at 250° C.

For the purpose of evaluation, breaking strength was measured by conducting a tensile test at ordinary temperature, and also Vickers hardness and the ball shape at bonding were observed. The results are shown in Table 1.

FIG. 1 shows the softening curves of small-diameter gold alloy wires (diameter; 0.8 mm) admixed with gadolinium (Gd), boron (B) and aluminum (Al).

For the evaluation of the ball shape, a high-speed automatic bonder was used to form a gold alloy ball by an arc discharge of an electric torch, and the ball shape was observed using a scanning electron microscope. A bond with a satisfactory shape is indicated by the mark "o" and a bond with a defective shape is indicated by the mark "x".

For the evaluation of the bonding strength, after the high-speed bonding, a lead frame and a semiconductor device to be measured were fixed by means of a jig, and a central portion of the small-diameter gold alloy wire was pulled apart to measure the tensile strength at breakage of the wire.

In view of a trend for finer wires, very fine wires produced using the high-purity gold alloys according to the present invention have a higher breaking strength, hardness and heat resistance than conventional high-purity gold alloy wires, are less subject to variations or disconnection, and permit stable bonding. Excellent electrical characteristics can also be achieved. Since the gold alloy wires of the present invention are improved especially in mechanical strength, hardness and heat resistance at ordinary temperature, tensile strength at high temperature is also high, the junction loop height can be reduced, and the gold alloy wires could be used satisfactorily in high-speed automatic bonding. Also, the ball shape was perfectly spherical and thus small, making it possible to improve the yield and reduce the cost.

To obtain gold alloys for dental use, mother alloys admixed with the aforementioned elements were prepared by using 4N pure gold having a gold purity of 99.99 weight %. The alloys were individually melted by high-frequency vacuum melting and were cast into ingots (20 mm×20 mm×150 mm). Subsequently, the ingots were heated at 800° C. for one hour and then rapidly cooled in water, followed by work hardening and age hardening. The working ratio was 99.5% and the aging treatment was performed at 250° C. for three hours.

Mechanical characteristics were evaluated as to Vickers hardness and tensile strength. The results are shown in Table 2.

The gold alloys according to the present invention have a gold content of 98.5 weight % or more, have increased hardness and tensile strength as mechanical properties, and are also improved in heat resistance and color tone. The gold alloys showed satisfactory strength for use in dental members.

Dental members are required to ensure biological safety, besides good mechanical properties. The above high-purity gold alloys have small amounts of additive elements contained therein, and thus it can be said that their degree of safety is high. By suitably selecting the additive elements, it is possible to obtain dental members satisfying both the mechanical and biological requirements. As for biological safety, different approval systems are adopted in different countries, and in Japan, approval by the Ministry of Welfare is required under the Pharmaceutical Affairs Law.

High-purity gold alloys admixed with 1,000 ppm of rare-earth elements and alkaline earth metals and having a gold purity of 99.9 weight % were prepared by way of experiment and the colors thereof were examined; as a result, it was found that the gold alloys admixed with Gd, La, Ce, Sm or Yb had a pure gold-like color and that among them, the gold alloy admixed with gadolinium (Gd) had a color most close to pure gold.

INDUSTRIAL APPLICABILITY

As described above, the high-purity hard gold alloy member according to the present invention is suitable for use as a decorative member such as a necklace, a watch, etc., an electronic member such as a bonding wire, a lead frame, a thin film, etc., and a dental member.

TABLE 1

CHARACTERISTICS OF SAMPLE HIGH-PURITY GOLD ALLOY WIRES

| | ADDITIVE ELEMENT (IN WEIGHT; ppm) | | | | | | | | TENSILE STRENGTH | | VICKERS HARDNESS | BALL |
|---|---|---|---|---|---|---|---|---|---|---|---|---|
| NO. | Gd | B | Ca | Be | Al | Si | Sb | Sm | BREAKING LOAD (gf) | ELONGATION (%) | (Hv) | SHAPE |
| 1 | 30.2 | 107 | | | | | | | 23.5 | 4 | 112 | ○ |
| 2 | 31.5 | 57 | | | | | | | 19.8 | 4 | 95 | ○ |

TABLE 1-continued

CHARACTERISTICS OF SAMPLE HIGH-PURITY GOLD ALLOY WIRES

| | ADDITIVE ELEMENT (IN WEIGHT; ppm) | | | | | | | | TENSILE STRENGTH | | VICKERS HARDNESS | BALL |
|---|---|---|---|---|---|---|---|---|---|---|---|---|
| NO. | Gd | B | Ca | Be | Al | Si | Sb | Sm | BREAKING LOAD (gf) | ELONGATION (%) | (Hv) | SHAPE |
| 3 | 30.4 | 1 | | | | | | | 9.8 | 4 | 83 | ○ |
| 4 | 0 | 104 | | | | | | | 18.9 | 4 | 89 | ○ |
| 5 | 0.9 | 101 | | | | | | | 19.8 | 4 | 90 | ○ |
| 6 | 31.5 | 109 | | | | | | | 23.5 | 4 | 111 | ○ |
| 7 | 108.5 | 105 | | | | | | | 21.8 | 4 | 132 | ○ |
| 8 | 30.2 | | 52 | | | | | | 16.8 | 4 | 81 | ○ |
| 9 | 31.2 | | | 58 | | | | | 16.6 | 4 | 80 | ○ |
| 10 | 30.5 | | | | 53 | | | | 14.2 | 4 | 74 | ○ |
| 11 | 30.4 | | | | | 56 | | | 16.8 | 4 | 81 | ○ |
| 12 | 31.1 | | | | | | 57 | | 14.8 | 4 | 75 | ○ |
| 13 | 30.9 | | | | | | | 52 | 13.9 | 4 | 70 | ○ |

NOTE: AS A GOLD MATERIAL, Au (99.995% or MORE) WAS MELTED.

TABLE 2

MECHANICAL PROPERTIES AND COLORS OF GOLD ALLOYS HAVING COMPOSITIONS ACCORDING TO THE PRESENT INVENTION

| | COMPOSITION OF ADDITIVES (ppm by weight) | | | | | | | | PROPERTIES | |
|---|---|---|---|---|---|---|---|---|---|---|
| NO. | Gd | B | Ca | Al | Si | Sm | Sb | Au + IMPUTITY | TENSILE STRENGTH (N) | HARDNESS (Hv) |
| 1 | 0 | | | | | | | BALANCE | 120 | 42 |
| 2 | 1,760 | | | | | | | | 193 | 123 |
| 3 | | 26 | | | | | | | 130 | 76 |
| 4 | | 104 | | | | | | | 163 | 96 |
| 5 | | | 986 | | | | | | 220 | 109 |
| 6 | | | | 1,980 | | | | | 250 | 123 |
| 7 | | | | | 300 | | | | | |
| 8 | | | | | | 1,520 | | | 230 | 126 |
| 9 | | | | | | | 185 | | 214 | 118 |
| 10 | 720 | 98 | | | | | | | 163 | 98 |
| 11 | 940 | | 490 | | | | | | 290 | 176 |
| 12 | | 28 | | 3,580 | | | | | 320 | 136 |
| 13 | 1,480 | 30 | | 3,480 | | | | | 396 | 162 |
| 14 | 1,530 | | 880 | | | | | | 210 | 194 |
| 15 | 1,480 | | 1,510 | 3,650 | | | | | 470 | 273 |
| 16 | 1,980 | | 1,960 | 9,890 | | | | | 720 | 295 |
| 17 | 1,970 | 102 | | 9,920 | | | | | 672 | 271 |
| 18 | 1,950 | | | 9,890 | | 1,980 | | | 688 | 282 |

What is claimed is:

1. A method of manufacturing a high-purity gold alloy, comprising subjecting a high-purity gold alloy having a Gd content of 1 to 49.9 ppm contained in Au having a purity of 99.98 weight % or more to solution heat treating in which the elements of the high-purity gold alloy are uniformly dispersed at a temperature higher than a solubility curve and then rapidly cooling the alloy, and then subjecting the high-purity gold alloy to age hardening, before or after an optional working of the high-purity gold alloy into a desired line shape or other desired shape.

2. The method of manufacturing a high-purity alloy according to claim 1, wherein the high-purity gold alloy further comprises 0.1 to 150 ppm of B.

3. The method of manufacturing a high-purity gold alloy according to claim 1, wherein the high-purity gold alloy further comprises one or more additives selected from the group consisting of Be, Al, Si, Ca, Sm, Y and Sb, and wherein a total additive amount of the additives is from 1 to 199 ppm.

4. The method of manufacturing a high-purity gold alloy according to claim 1, wherein the high-purity gold alloy further comprises one or more additives selected from the group consisting of rare-earth metals and alkaline earth metals, and wherein a total additive amount of the additives is from 1 to 199 ppm.

5. The method of manufacturing a high-purity gold alloy according to claim 2, wherein the high-purity gold alloy further comprises one or more additives selected from the group consisting of Be, Al, Si, Ca, Sm, Y and Sb, and wherein a total additive amount of the additives is from 1 to 199 ppm.

6. The method of manufacturing a high-purity gold alloy according to claim 2, wherein the high-purity gold alloy further comprises one or more additives selected from the group consisting of rare-earth metals and alkaline earth metals, and wherein a total additive amount of the additives is from 1 to 199 ppm.

7. The method of manufacturing a high-purity gold alloy according to claim 3, wherein the high-purity gold alloy further comprises one or more additives selected from the group consisting of rare-earth metals and alkaline earth metals, and wherein a total additive amount of additives ranges from 1 to 199 ppm.

8. A method of manufacturing a high-purity gold alloy comprising subjecting a high-purity gold alloy having a Gd content of 5 to 99 ppm contained in Au having a purity of 99.98 weight % or more to solution heat treating in which the elements of the high-purity gold alloy are uniformly dispersed at a temperature higher than a solubility curve and then rapidly cooling the alloy, and then subjecting the high-purity gold alloy to age hardening, before or after an optional working of the high-purity gold alloy into a desired line shape.

9. The method of manufacturing a high-purity alloy according to claim 8, wherein the high-purity gold alloy further comprises 0.1 to 150 ppm of B.

10. The method of manufacturing a high-purity gold alloy according to claim 8, wherein the high-purity gold alloy further comprises one or more additives selected from the group consisting of Be, Al, Si, Ca, Sm, Y and Sb, and wherein a total additive amount of the additives is from 1 to 199 ppm.

11. The method of manufacturing a high-purity gold alloy according to claim 8, wherein the high-purity gold alloy further comprises one or more additives selected from the group consisting of rare-earth metals and alkaline earth metals, and wherein a total additive amount of the additives is from 1 to 199 ppm.

12. The method of manufacturing a high-purity gold alloy according to claim 9, wherein the high-purity gold alloy further comprises one or more additives selected from the group consisting of Be, Al, Si, Ca, Sm, Y and Sb, and wherein a total additive amount of the additives is from 1 to 199 ppm.

13. The method of manufacturing a high-purity gold alloy according to claim 9, wherein the high-purity gold alloy further comprises one or more additives selected from the group consisting of rare-earth metals and alkaline earth metals, and wherein a total additive amount of the additives is from 1 to 199 ppm.

14. The method of manufacturing a high-purity gold alloy according to claim 10, wherein the high-purity gold alloy further comprises one or more additives selected from the group consisting of rare-earth metals and alkaline earth metals, and wherein a total additive amount of the additives is from 1 to 199 ppm.

15. A process of manufacturing a high-purity gold alloy comprising subjecting a high-purity gold alloy having a Gd content of 50 to 14,999 ppm contained in 98.50 to 99.69 weight % gold to solution heat treating in which the elements of the high-purity gold alloy are uniformly dispersed at a temperature higher than a solubility curve and then rapidly cooling the alloy, and then subjecting the high-purity gold alloy to age hardening, before or after an optional working of the high-purity gold alloy into a desired line shape or other desired shape.

16. The method of manufacturing a high-purity alloy according to claim 15, wherein the high-purity gold alloy further comprises 0.1 to 150 ppm of B.

17. The method of manufacturing a high-purity gold alloy according to claim 15, wherein the high-purity gold alloy further comprises one or more additives selected from the group consisting of Be, Al, Si, Ca, Sm, Y and Sb, and wherein a total additive amount of the additives is from 3,001 to 14,999 ppm.

18. The method of manufacturing a high-purity gold alloy according to claim 15, wherein the high-purity gold alloy further comprises one or more additives selected from rare-earth metals and alkaline earth metals, and wherein a total additive amount of the additives is from 3,001 to 14,999 ppm.

19. The method of manufacturing a high-purity gold alloy according to claim 16, wherein the high-purity gold alloy further comprises one or more additives selected from the group consisting of Be, Al, Si, Ca, Sm, Y and Sb, and wherein a total additive amount of the additives is from 3,001 to 14,999 ppm.

20. The method of manufacturing a high-purity gold alloy according to claim 16, wherein the high-purity gold alloy further comprises one or more additives selected from the group consisting of rare-earth metals and alkaline earth metals, and wherein a total additive amount of the additives is from 3,001 to 14,999 ppm.

21. The method of manufacturing a high-purity gold alloy according to claim 17, wherein the high-purity gold alloy further comprises one or more additives selected from the group consisting of rare-earth metals and alkaline earth metals, and wherein a total additive amount of the additives is from 3,001 to 14,999 ppm.

22. The method of manufacturing a high-purity gold alloy according to claim 1, wherein the solution heat treatment is performed at a heating temperature of 600 to 2,800° C., and the aging treatment is performed at a temperature of 150 to 350° C.

23. The method of manufacturing a high-purity gold alloy according to claim 1, wherein after the solution heat treatment, the working process and the age hardening treatment are alternately repeated.

24. A high-purity gold alloy comprising 1 to 49.9 ppm of Gd contained in 99.98 weight % or more of Au, and one or more additives selected from the group consisting of Be, Al, Si, Ca, Sm, Y and Sb, wherein a total additive amount of the additives is from 1 to 199 ppm, and said alloy is a solution heat-treated and aging-treated alloy.

25. A high-purity gold alloy comprising 1 to 49.9 ppm of Gd contained in 99.98 weight % or more of Au, and one or more additives selected from the group consisting of rare earth metals and alkaline earth metals, wherein a total additive amount of the additives is from 1 to 199 ppm, and said alloy is a solution heat-treated and aging-treated alloy.

26. A high-purity gold alloy comprising 1 to 49.9 ppm of Gd contained in 99.98 weight % or more of Au, and one or more additives selected from the group consisting of Be, Al, Si, Ca, Sm, Y and Sb, wherein a total additive amount of the additives is from 1 to 199 ppm, said alloy is a solution heat-treated and aging-treated alloy, and said alloy further comprises 0.1 to 150 ppm of B.

27. A high-purity gold alloy comprising 1 to 49.9 ppm of Gd contained in 99.98 weight % or more of Au, and one or more additives selected from the group consisting of rare earth metals and alkaline earth metals, wherein a total additive amount of the additives is from 1 to 199 ppm, said alloy is a solution heat-treated and aging-treated alloy, and said alloy further comprises 0.1 to 150 ppm of B.

28. A high-purity gold alloy comprising 50 to 14,999 ppm of Gd contained in 98.50 to 99.69 weight % of Au, and one or more additives selected from the group consisting of Be, Al, Si, Ca, Sm, Y and Sb, wherein a total additive amount of the additives is from 3,001 to 14,999 ppm, and said alloy is a solution heat-treated and aging-treated alloy.

29. A high-purity gold alloy comprising 50 to 14,999 ppm of Gd contained in 98.50 to 99.69% weight % of Au, and one or more additives selected from the group consisting of rare earth metals and alkaline earth metals, wherein a total additive amount of the additives is from 3,001 to 14,999 ppm, and said alloy is a solution heat-treated and aging-treated alloy.

30. A high-purity gold alloy comprising 50 to 14,999 ppm of Gd contained in 98.50 to 99.69 weight % of Au, and one or more additives selected from the group consisting of Be, Al, Si, Ca, Sm, Y and Sb, wherein a total additive amount of the additives is from 3,001 to 14,999 ppm, said alloy is a solution heat-treated and aging-treated alloy, and said high-purity gold alloy further comprises 0.1 to 150 ppm of B.

31. A high-purity gold alloy comprising 50 to 14,999 ppm of Gd contained in 98.50 to 99.69 weight % of Au, and one or more additives selected from the group consisting of rare earth metals and alkaline earth metals, wherein a total additive amount of the additives is from 3,001 to 14,999 ppm, said alloy is a solution-heat-treated and aging-treated alloy, and said high-purity gold alloy further comprises 0.1 to 150 ppm of B.

* * * * *